(12) United States Patent
Breen et al.

(10) Patent No.: US 9,139,435 B2
(45) Date of Patent: Sep. 22, 2015

(54) METHOD FOR PREPARING SEMICONDUCTOR NANOCRYSTALS

(71) Applicant: QD VISION, INC., Lexington, MA (US)

(72) Inventors: Craig Breen, Somerville, MA (US); Wenhao Liu, Somerville, MA (US)

(73) Assignee: QD VISION, INC., Lexington, MA (US)

( * ) Notice: Subject to any disclaimer, the term of this patent is extended or adjusted under 35 U.S.C. 154(b) by 0 days.

(21) Appl. No.: 14/081,755

(22) Filed: Nov. 15, 2013

(65) Prior Publication Data

US 2014/0140918 A1 May 22, 2014

Related U.S. Application Data

(63) Continuation of application No. PCT/US2012/038198, filed on May 16, 2012.

(60) Provisional application No. 61/486,748, filed on May 16, 2011, provisional application No. 61/537,008, filed on Sep. 20, 2011.

(51) Int. Cl.
| | | |
|---|---|---|
| C01B 19/04 | (2006.01) | |
| C04B 35/00 | (2006.01) | |
| H01L 29/12 | (2006.01) | |
| C01B 19/00 | (2006.01) | |
| B82Y 30/00 | (2011.01) | |
| B82Y 40/00 | (2011.01) | |
| H01L 21/02 | (2006.01) | |

(52) U.S. Cl.
CPC .............. *C01B 19/04* (2013.01); *C01B 19/007* (2013.01); *B82Y 30/00* (2013.01); *B82Y 40/00* (2013.01); *C01P 2002/84* (2013.01); *C01P 2004/64* (2013.01); *C01P 2006/60* (2013.01); *H01L 21/0237* (2013.01); *H01L 21/0256* (2013.01); *H01L 21/02428* (2013.01); *H01L 21/02557* (2013.01); *H01L 21/02601* (2013.01); *H01L 21/02628* (2013.01)

(58) Field of Classification Search
USPC ............ 423/508, 511, 561.1, 566.1; 977/774, 977/813; 252/62.3 GA, 62.3 ZB, 62.3 ZT, 252/62.3 C
See application file for complete search history.

(56) References Cited

U.S. PATENT DOCUMENTS

| | | | |
|---|---|---|---|
| 3,760,000 | A | 9/1973 | Curry |
| 5,677,545 | A | 10/1997 | Shi et al. |
| 6,319,426 | B1 | 11/2001 | Bawendi et al. |
| 6,322,901 | B1 | 11/2001 | Bawendi et al. |
| 6,576,291 | B2 | 6/2003 | Bawendi et al. |
| 6,607,829 | B1 | 8/2003 | Bawendi et al. |
| 6,815,064 | B2 | 11/2004 | Treadway et al. |
| 6,869,545 | B2 | 3/2005 | Peng et al. |
| 6,872,249 | B2 | 3/2005 | Peng et al. |
| 6,949,206 | B2 | 9/2005 | Whiteford et al. |
| 7,147,712 | B2 | 12/2006 | Zehnder et al. |
| 7,160,613 | B2 | 1/2007 | Bawendi et al. |
| 7,208,133 | B2 | 4/2007 | Cho et al. |
| 7,253,452 | B2 | 8/2007 | Steckel et al. |
| 7,374,807 | B2 | 5/2008 | Parce et al. |
| 7,824,731 | B2 | 11/2010 | Ying et al. |
| 7,919,012 | B2 | 4/2011 | Peng et al. |
| 8,354,785 | B2 | 1/2013 | Clough et al. |
| 8,718,437 | B2 | 5/2014 | Coe-Sullivan et al. |
| 2003/0059635 | A1 | 3/2003 | Naasani |
| 2003/0145779 | A1 | 8/2003 | Alivisatos et al. |
| 2003/0186914 | A1 | 10/2003 | Hofer et al. |
| 2004/0023010 | A1 | 2/2004 | Bulovic et al. |
| 2004/0023261 | A1 | 2/2004 | Bruchez et al. |
| 2004/0048241 | A1 | 3/2004 | Freeman et al. |
| 2004/0146560 | A1 | 7/2004 | Whiteford et al. |
| 2004/0178390 | A1 | 9/2004 | Whiteford et al. |
| 2004/0265571 | A1 | 12/2004 | Schwartz et al. |
| 2005/0129947 | A1 | 6/2005 | Peng et al. |
| 2005/0258418 | A1 | 11/2005 | Steckel et al. |
| 2005/0265922 | A1 | 12/2005 | Nie et al. |
| 2005/0266246 | A1 | 12/2005 | Reiss et al. |
| 2006/0061017 | A1 | 3/2006 | Strouse et al. |
| 2006/0083694 | A1 | 4/2006 | Kodas et al. |
| 2006/0128845 | A1 | 6/2006 | Emrick et al. |
| 2006/0216508 | A1 | 9/2006 | Denisyuk et al. |
| 2006/0216510 | A1 | 9/2006 | Denisyuk et al. |
| 2006/0216759 | A1 | 9/2006 | Naasani |

(Continued)

FOREIGN PATENT DOCUMENTS

| | | |
|---|---|---|
| AU | A-54514/96 | 12/1996 |
| JP | 2002053319 A | 2/2002 |

(Continued)

OTHER PUBLICATIONS

Cumberland, et al., "Inorganic Clusters as Single-Source Precursors for Preparation of CdSe, ZnSe, and CdSe/ZnS Nanomaterials", Chem. Mater. (2002) vol. 14, p. 1576.
Dabbousi, et al., "(CdSe) ZnS Core-Shell Quantum Dots: Synthesis and Characterizaqtion of a Size Series of Highly Luminescent Nanocrystallites", J. Phys. Chem. 101, 9463, 1997.
Doussineau, et al., "Synthesis of Phosphonic Acids with the Semicarbazide Group for the Functionalization of Metal Oxide and Zeolite Nanoparticles", SYNLETT (2004) No. 10, pp. 1735-1738.
Dukes, A.D. III et al., "Synthesis of Magic-Sized CdSe and CdTe Nanocrystals with Diisooctylphosphinic Acid", Chem. Mater, (2010), vol. 22, pp. 6402-6408.

(Continued)

*Primary Examiner* — Timothy Vanoy

(57) ABSTRACT

A method for making semiconductor nanocrystals is disclosed, the method comprising adding a secondary phosphine chalcogenide to a solution including a metal source and a liquid medium at a reaction temperature to form a reaction product comprising a semiconductor comprising a metal and a chalcogen, and quenching the reaction mixture to form quantum dots. Methods for overcoating are also disclosed. Semiconductor nanocrystals are also disclosed.

20 Claims, No Drawings

(56) References Cited

U.S. PATENT DOCUMENTS

| | | |
|---|---|---|
| 2007/0059527 A1 | 3/2007 | Jun et al. |
| 2007/0072979 A1 | 3/2007 | Moad et al. |
| 2007/0103068 A1 | 5/2007 | Bawendi et al. |
| 2007/0104865 A1 | 5/2007 | Pickett |
| 2007/0269904 A1 | 11/2007 | Uyeda et al. |
| 2008/0001167 A1 | 1/2008 | Coe-Sullivan et al. |
| 2008/0089836 A1 | 4/2008 | Hainfeld |
| 2008/0118755 A1 | 5/2008 | Whiteford et al. |
| 2008/0252209 A1 | 10/2008 | Jang et al. |
| 2008/0268248 A1 | 10/2008 | Jang et al. |
| 2008/0296144 A1 | 12/2008 | Strouse et al. |
| 2009/0152567 A1 | 6/2009 | Comerford et al. |
| 2009/0162011 A1 | 6/2009 | Coe-Sullivan et al. |
| 2009/0181478 A1 | 7/2009 | Cox et al. |
| 2009/0203196 A1 | 8/2009 | Kim et al. |
| 2009/0215208 A1 | 8/2009 | Coe-Sullivan et al. |
| 2009/0215209 A1 | 8/2009 | Anc et al. |
| 2009/0230382 A1 | 9/2009 | Banin et al. |
| 2009/0251759 A1 | 10/2009 | Domash et al. |
| 2009/0278141 A1 | 11/2009 | Coe-Sullivan et al. |
| 2009/0283743 A1 | 11/2009 | Coe-Sullivan et al. |
| 2009/0283778 A1 | 11/2009 | Coe-Sullivan et al. |
| 2010/0001256 A1 | 1/2010 | Coe-Sullivan et al. |
| 2010/0044635 A1 | 2/2010 | Breen et al. |
| 2010/0044636 A1 | 2/2010 | Ramprasad et al. |
| 2010/0051870 A1 | 3/2010 | Ramprasad |
| 2010/0051901 A1 | 3/2010 | Kazlas et al. |
| 2010/0052512 A1 | 3/2010 | Clough et al. |
| 2010/0068468 A1 | 3/2010 | Coe-Sullivan et al. |
| 2010/0108530 A1 | 5/2010 | Zehnder et al. |
| 2010/0132770 A1 | 6/2010 | Beatty et al. |
| 2010/0140586 A1 | 6/2010 | Char et al. |
| 2010/0265307 A1 | 10/2010 | Linton et al. |
| 2010/0283014 A1 | 11/2010 | Breen et al. |
| 2010/0283072 A1 | 11/2010 | Kazlas et al. |
| 2010/0289003 A1 | 11/2010 | Kahen et al. |
| 2010/0314646 A1 | 12/2010 | Breen et al. |
| 2011/0049442 A1 | 3/2011 | Schreuder et al. |
| 2011/0052918 A1* | 3/2011 | Krauss et al. ............... 428/402 |
| 2011/0103064 A1 | 5/2011 | Coe-Sullivan et al. |
| 2011/0186811 A1 | 8/2011 | Coe-Sullivan et al. |
| 2011/0220194 A1 | 9/2011 | Kurtin et al. |
| 2011/0220844 A1 | 9/2011 | Tulsky et al. |
| 2011/0223425 A1 | 9/2011 | Schreuder et al. |
| 2011/0226991 A1 | 9/2011 | Treadway et al. |
| 2011/0233483 A1 | 9/2011 | Breen et al. |
| 2011/0245533 A1 | 10/2011 | Breen et al. |
| 2011/0260111 A1 | 10/2011 | Nie et al. |

FOREIGN PATENT DOCUMENTS

| | | |
|---|---|---|
| JP | 2002079076 A | 3/2002 |
| KR | 20070029915 A | 3/2007 |
| WO | WO 2009120688 A1 | 10/2009 |
| WO | WO 2013078242 A1 | 5/2013 |
| WO | WO 2013078245 A1 | 5/2013 |
| WO | WO 2013078247 A1 | 5/2013 |
| WO | WO 2013078249 A1 | 5/2013 |

OTHER PUBLICATIONS

Evans, C.M., et al., "Mysteries of TOPSe Revealed: Insights Into Quantum Dot Nucleation", J. Am. Chem. Soc. (published online Jul. 26, 2010), vol. 132 (32), pp. 10973-10975.

Evans, C.M., et al., Supporting Information for: "Mysteries TOPSe Revealed: Insights Into Quantum Dot Nucleation", J. Am. Chem. Soc. (published online Jul. 26, 2010), vol. 132 (32), pp. 10973-10975.

Gomes, et al., "Binding of Phosphonic Acids to CdSe Quantum Dots: A Solution NMR Study", J. Phys. Chem. Lett. (2011) vol. 2, pp. 145-152.

Gong, "Synthesis, optical properties, and surface modification of magic-size semiconductor nanocrystals, nanowires and nanoplatelets" Thesis presented to the Faculty at San Diego State University (2011).

Koole, et al., "Paramagnetic lipid-coated silica nanoparticles with a fluorescent quantum dot core: a new contrast agent platform for multimodality imaging", Bioconjugate Chemistry (2008) vol. 19, No. 12, pp. 2471-2479.

Kopping, et al., "Identification of Acidic Phosporous-Containing Ligands Involved in the Surface Chemistry of CdSe Nanoparticles Prepared in Tri-N-octylphosphine Oxide Solvents", J. Am. Chem. Soc. (2008), vol. 130, pp. 5689-5698.

Kopping, et al., Supporting Information for: "Identification of Acidic Phosphorus-Containing Ligands Involved in the Surface Chemistry of CdSe Nanoparticles Prepared in Tri-N-octylphosphine Oxide Solvents", J. Am. Chem. Soc. (2008), vol. 130, pp. 5689-5698.

LEDs Magazine (Feb. 9, 2010) "Quantum dots begin to impact backlight and general illumination applications", (http://ledsmagazine.com/news/7/2/12).

Lorenz, et al., "Surfactant—Semiconductor Interfaces: Perturbation of the Photoluminescence of Bulk Cadmium Selenide by Adsorption of Tri-n-octylphosphine Oxide as a Probe of Solution Aggregation with Relevance to Nanocrystal Stabilization", J. Am. Chem. Soc. (1998) vol. 120, No. 42, pp. 10970-10975.

Murray, C., et al., "Synthesis and Characterization of Nearly Monodisperse CdE (E=S, Se, Te) Semiconductor Nanocrystallites" (Nov. 1993), J. Am, Chem. Soc., 115, pp. 8706-8715.

Murray, C.B., et al., "Synthesis and Characterization of Monodisperse Nanocrystals and Close-Packed Nanocrystal Assemblies", Annu. Rev. Mater. Sci,, 2000, 30: pp. 545-610.

Nexxus Lighting, Inc., QD Vision, Inc.,"Nexxus Lighting Delivers First Commercially-Available Dot-LED Replacement Light Bulbs" LED Professional (Mar. 12, 2010) (http://www.led-professional.com/products/led-lamps/nexxus-lighting-delivers-first-commercially-available-quantum-dot-led-replacement-light-bulbs).

Owen, et al., "Precursor Conversion Kinetics and the Nucleation of Cadmium Selenide Nanocrystals", J. Am. Chem. Soc., (2010), vol. 132, pp. 18206-18213.

Owen, et al., Supporting InformationJor: "Precursor Conversion Kinetics and the Nucleation of Cadmium Selenide Nanocrystals", J. Am. Chem. Soc., (2010), vol. 132, pp. S1-S13.

PCT Search Report and Written Opinion for PCT/US2012/038198 mailed Jan. 10, 2013. (PCT/US2012/038198 is the parent of U.S. Appl. No. 14/081,755, which is this case.

Peng, et al., "Mechanisms of the Shape Evolution of CdSe Nanocrystals" J. Am. Chem. Soc. (2001) vol. 123, pp. 1389-1395.

Puzder, et al., "The Effect of Organic Ligand Binding on the Growth CdSe Nanoparticles Probed by Ab-Initio Calculations", Nanoletters (2004) vol. 4, No. 12.

QD Vision, Inc., "QLED Technology" QD Vision (Oct. 18, 2010) (http://web.archive.org/web/20101018132134/http://www.qdvision.com/qled-technology).

Schreuder, et al., "Control of Surface State Emission via Phosphonic Acid Modulation in Ultrasmall CdSe Nanocrystals: The Role of Ligand Electronegativity", J. Phys. Chem. C (2009), vol. 113, pp. 8169-8176.

Talapin, et al., "Highly Luminescent Monodisperse CdSe and CdSe/ZnS Nanocrystals Synthesized in a Hexadecylamine—Trioctylphosphine Oxide—Trioctylphospine Mixture", Nano Lett. (2001), vol. 1, No. 4, pp. 207-211.

Wang, F., et al., "Spectroscopic Identification of Tri-n-octylphoshphine Oxide (TOPO) Impurities and Elucidation of Their Roles in Cadmium Selenide Quantum-Wire Growth", J. Am. Chem. Soc. (2009), vol. 131, pp. 4983-4994.

Wang, F., et al., "The Trouble with TOPO; Identification of Adventitious Impurities Beneficial to the Growth of Cadmium Selenide Quantum Dots, Rods, and Wires", Nano Lett., (2008), vol. 8 (10), pp. 3521-3524.

Wang, F., et al., Supporting Information for: "Spectroscopic Identification of Tri-n-octylphoshphine Oxide (TOPO) Impurities and Elucidation of Their Roles in Cadmium Selenide Quantum-Wire Growth", Department of Chemistry and Center for Materials Innovation, Washington University, Saint Louis, Missouri. (pp. S1-S49).

Wang, F., et al., Supporting Information for: "The Trouble with TOPO; Identification of Adventitious Impurities Beneficial to the Growth of Cadmium Selenide Quantum Dots, Rods, and Wires",

(56) References Cited

OTHER PUBLICATIONS

Department of Chemistry and Center for Materials Innovation, Washington University, Saint Louis, Missouri. (pp. S1-S7).

Xie, R., "Synthesis and Characterization of Highly Luminescent CdSe—Core CdS/Zn0.5Cd0.5S/ZnS Multishell Nanoycrystals", J. Am. Chem. Soc. (2005) vol. 127, pp. 7480-7488.

Steckel, Jonathan S., Thesis entitled "The Synthesis of Inorganic Semiconductor Nanocrystalline Materials For the Purpose of Creating Hybrid Organic/Inorganic Light-Emitting Devices", Massachusetts Institute of Technology, Sep. 2006. See, for example, Sections 2.2, 2.3, and 3.2.

Pietryga, J.M., et al., "Utilizing the Lability of Lead Selenide to Produce Heterostructured Nanocrystals with Bright, Stable Infrared Emission", J. Am. Chem. Soc. 2008, 130, 4879-4885.

Wang, F., et al., "Morphology Control of Cadmium Selenide Nanocrystals: Insights into the Roles of Di-n-octylphosphine Oxide (DOPO) and Di-n-octylphosphonic Acid (DOPA)", J. Am. Chem. Soc. 2012, 134, 5369-5380.

Wang, F., et al., Supporting Information for "Morphology Control of Cadmium Selenide Nanocrystals: Insights into the Roles of Di-n-octylphosphine Oxide (DOPO) and Di-n-octylphosphonic Acid (DOPA)", J. Am. Chem. Soc. 2012, 134, 5369-5380.

Wolcott, A., et al., "CdSe Quantum Rod Formation Aided By In Situ TOPO Oxidation", Chem. Mater. 2010, 22, 2814-2821.

Wolcott, A., et al., Supporting Information for "CdSe Quantum Rod Formation Aided By In Situ TOPO Oxidation", Chem. Mater. 2010, 22, 2814-2821.

Attachment A—Activity Timeline.

* cited by examiner

METHOD FOR PREPARING SEMICONDUCTOR NANOCRYSTALS

This application is a continuation of International Application No. PCT/US2012/038198, filed 16 May 2012, which was published in the English language as International Publication No. WO 2012/158832 on 22 Nov. 2012, which International Application claims priority to U.S. Provisional Patent Application No. 61/486,748 filed 16 May 2011 and U.S. Provisional Patent Application No. 61/537,008 filed 20 Sep. 2011. Each of the foregoing is hereby incorporated herein by reference in its entirety.

TECHNICAL FIELD OF THE INVENTION

The present invention relates to the field of nanotechnology and more particularly to a method for preparing semiconductor nanocrystals.

SUMMARY OF THE INVENTION

The present invention relates to methods of making semiconductor nanocrystals. In accordance with one aspect of the present invention there is provided a method for making semiconductor nanocrystals, the method comprising adding a secondary phosphine chalcogenide to a solution including a metal source and a liquid medium at a reaction temperature to form a reaction product comprising a semiconductor comprising a metal and a chalcogen, and quenching the reaction mixture to form quantum dots. According to certain aspects, the secondary phosphine chalcogenide may be a secondary phosphine sulfide, a secondary phosphine selenide, a secondary phosphine telluride, or a secondary phosphine oxide. According to one aspect, the solution may further include carboxylate species, a phosphonate species, or a phosphonite species.

According to a certain aspect, the step of quenching includes cooling the reaction mixture immediately upon completion of addition of the secondary phosphine chalcogenide, for example, to stop growth of the semiconductor nanocrystals formed in reaction mixture. According to one aspect, is cooled to a temperature that is about 200° C. or below. According to an additional aspect, the reaction mixture is cooled to a temperature that is about 100° C. or below and the semiconductor nanocrystals are isolated after cooling.

According to one aspect, at least a portion of the isolated semiconductor nanocrystals are overcoated with a coating. According to an additional aspect, the coating comprises one or more semiconductor materials. According to an additional aspect, the coating comprises two or more layers.

In accordance another aspect of the present invention there is provided a method for preparing semiconductor nanocrystals, the method comprising mixing a chalcogen source with an oxygen-treated tertiary phosphine to form a chalcogen precursor, forming a reaction mixture including the chalcogen precursor and a metal precursor, and heating the reaction mixture to form semiconductor nanocrystals comprising a metal and a chalcogen.

In certain embodiments, the method comprises mixing a first solution formed by adding at least one chalcogen source to an oxygen-treated liquid tertiary phosphine with a second solution including at least one metal precursors to form a reaction mixture and heating the reaction mixture to form semiconductor nanocrystals comprising at least one metal and at least one chalcogen.

In accordance with a certain aspect of the present invention, a method is provided for increasing the yield of quantum dots using the invention described herein. For example, the method includes providing a solution of a metal source at a reaction temperature and to which a secondary phosphine chalcogenide or secondary phosphine chalcogenide precursor or oxygen-treated tertiary phosphine chalcogenide is rapidly added to the solution of the metal source whereupon nanocrystals including the metal and the chalcogenide form in a reaction mixture. The reaction is terminated resulting in nanocrystals of certain size.

In accordance with another aspect of the present invention, there is provided a method for increasing the yield of semiconductor nanocrystals. The method comprises mixing a chalcogen source with an oxygen-treated tertiary phosphine to form a chalcogen precursor, forming a reaction mixture including the chalcogen precursor and one or more metal precursors, and heating the reaction mixture to form semiconductor nanocrystals comprising one or more metals and one or more chalcogens.

In certain embodiments, a yield increase of at least 2 times can be achieved.

In certain embodiments, the method comprises mixing a first solution formed by adding at least one chalcogen source to an oxygen-treated liquid tertiary phosphine with a second solution including at least one metal precursors to form a reaction mixture and heating the reaction mixture to form semiconductor nanocrystals comprising at least one metal and at least one chalcogen.

The above methods can further comprise forming one or more overcoating layers over at least a portion, and preferably all, of an outer surface of at least a portion of the semiconductor nanocrystals.

The semiconductor nanocrystals can be isolated from the reaction mixture prior to formation of one or more overcoating layers.

An overcoating layer can comprise one or more inorganic materials. An overcoating layer can comprise one or more semiconductor materials. An overcoating layer can comprise one or more different semiconductor materials. An overcoating layer can comprise more than one layer. When multiple layers are included on the semiconductor nanocrystals, each layer can have a composition that is the same or different from that of an adjacent layer. When multiple layers are included on the semiconductor nanocrystals, each layer can have a composition that is same or different from that of any other layer.

In accordance with yet another aspect of the present invention, there is provided a method for overcoating semiconductor nanocrystals. The method comprises forming a reaction mixture including at least one secondary phospine and at least one metal source in the presence of semiconductor nanocrystals to form a reaction mixture and heating the reaction mixture to form an overcoating comprising at least one metal and at least one chalcogen on at least a portion of an outer surface of at least a portion of the semiconductor nanocrystals included in the reaction mixture. According to certain aspects, the secondary phosphine chalcogenide may be a secondary phosphine sulfide, a secondary phosphine selenide, a secondary phosphine telluride, or a secondary phosphine oxide.

In accordance with yet another aspect of the present invention there is provided a method for overcoating semiconductor nanocrystals. The method comprises mixing at least one chalcogen source with an oxygen-treated tertiary phosphine to form a chalcogen precursor, forming a reaction mixture including the chalcogen precursor and at least one metal precursor in the presence of semiconductor nanocrystals to form a reaction mixture and heating the reaction mixture to form an overcoating comprising at least one metal and at least one chalcogen on at least a portion of an outer surface of at least a portion of the semiconductor nanocrystals included in the reaction mixture.

Each of the claims set forth at the end of the present application are hereby incorporated into this Summary section by reference in its entirety.

The foregoing, and other aspects and embodiments described herein all constitute embodiments of the present invention.

It should be appreciated by those persons having ordinary skill in the art(s) to which the present invention relates that any of the features described herein in respect of any particular aspect and/or embodiment of the present invention can be combined with one or more of any of the other features of any other aspects and/or embodiments of the present invention described herein, with modifications as appropriate to ensure compatibility of the combinations. Such combinations are considered to be part of the present invention contemplated by this disclosure.

It is to be understood that both the foregoing general description and the following detailed description are exemplary and explanatory only and are not restrictive of the invention as claimed. Other embodiments will be apparent to those skilled in the art from consideration of the specification and practice of the invention disclosed herein.

DETAILED DESCRIPTION OF THE INVENTION

Embodiments of the present disclosure are directed to methods of making quantum dots. Quantum dots or nanocrystals are nanometer sized semiconductor particles that can have optical properties arising from quantum confinement. Quantum dots can have various shapes, including, but not limited to, a sphere, a rod, a disk, other shapes, and mixtures of various shaped particles. The particular composition(s), structure, and/or size of a quantum dot can be selected to achieve the desired wavelength of light to be emitted from the quantum dot upon stimulation with a particular excitation source. In essence, quantum dots may be tuned to emit light across the visible spectrum by changing their size. See C. B. Murray, C. R. Kagan, and M. G. Bawendi, *Annual Review of Material Sci.*, 2000, 30: 545-610 hereby incorporated by reference in its entirety. The narrow FWHM of quantum dots can result in saturated color emission. In certain embodiments, FWHM can be, for example, less than 60, less than 50, less than 40 or less than 30. The broadly tunable, saturated color emission over the entire visible spectrum of a single material system is unmatched by any class of organic chromophores (see, for example, Dabbousi et al., J. Phys. Chem. 101, 9463 (1997), which is incorporated by reference in its entirety). A monodisperse population of quantum dots will emit light spanning a narrow range of wavelengths.

Embodiments of the present disclosure are directed to methods of making quantum dots (also referred to herein as semiconductor nanocrystals). Quantum dots of certain size can be made according to a reaction process described herein which is terminated or quenched before Ostwald ripening or broadening of the size distribution of the semiconductor particles occurs. According to an embodiment, the quantum dots produced by the methods of the present invention may further be provided with a coating or shell or layer.

According to certain aspects of the present disclosure, a secondary phosphine chalcogenide or secondary phosphine chalcogenide precursor or oxygen-treated tertiary phosphine is added to a solution of a metal source (also referred to herein as a metal precursor) at a reaction temperature to form a reaction mixture. (A secondary phosphine chalcogenide, a secondary phosphine chalcogenide precursor, and an oxygen-treated tertiary phosphine may also be referred to herein as a chalcogen precursor.) In certain embodiments, the secondary phosphine chalcogenide precursor comprises at least 10% secondary phosphine chalcogenide by weight, e.g., at least 20% secondary phosphine chalcogenide by weight, at least 30% secondary phosphine chalcogenide by weight, at least 40% secondary phosphine chalcogenide by weight, at least 50% secondary phosphine chalcogenide by weight, at least 60% secondary phosphine chalcogenide by weight, at least 70% secondary phosphine chalcogenide by weight, at least 80% secondary phosphine chalcogenide by weight, at least 90% secondary phosphine chalcogenide by weight, up to 100% secondary phosphine chalcogenide by weight. The reaction is then terminated or quenched.

According to one aspect, the reaction is terminated or quenched so as to stop growth of the quantum dots before the quantum dots Ostwald ripen or the size distribution broadens or the quantum dots combine together in an undesirable manner. According to one aspect, termination of the reaction comprises cooling the reaction mixture to a quenching temperature effective to terminate or quench the reaction in a manner to stop or limit further growth of the semiconductor nanocrystals. In an additional aspect, the reaction mixture is cooled to a temperature effective to quench or stop growth of the semiconductor nanocrystals formed in the reaction mixture prior to Ostwald ripening which results in particle size distribution broadening.

According to a certain aspect, the step of quenching includes cooling the reaction mixture immediately upon completion of addition of the secondary phosphine chalcogenide, for example, to stop growth of the semiconductor nanocrystals formed in reaction mixture. According to one aspect, is cooled to a temperature that is about 200° C. or below. According to an additional aspect, the reaction mixture is cooled to a temperature that is about 100° C. or below and the semiconductor nanocrystals are isolated after cooling.

Quantum dots are present in the reaction vessel and may be isolated or recovered.

According to certain aspects, the secondary phosphine chalcogenide may be a secondary phosphine sulfide, a secondary phosphine selenide, a secondary phosphine telluride, or a secondary phosphine oxide. According to one aspect, the solution may further include carboxylate species, a phosphonate species, or a phosphonite species.

A chalcogen can include elemental oxygen, sulfur, selenium, and tellurium.

In accordance with one aspect of the present invention there is provided a method for preparing semiconductor nanocrystals, the method comprising mixing a chalcogen source with an oxygen-treated tertiary phosphine to form a chalcogen precursor, forming a reaction mixture including the chalcogen precursor and a metal precursor, and heating the reaction mixture to form semiconductor nanocrystals comprising a metal and a chalcogen.

Examples of metals include, but are not limited to, those from Groups 11, 12, and/or 14 of the Periodic Table.

In certain embodiments, the method comprises mixing a first solution formed by adding at least one chalcogen source to an oxygen-treated liquid tertiary phosphine with a second solution including at least one metal precursors to form a reaction mixture and heating the reaction mixture to form semiconductor nanocrystals comprising at least one metal and at least one chalcogen.

The method can further comprise forming one or more overcoating layers over at least a portion, and preferably all, of an outer surface of at least a portion of the semiconductor nanocrystals.

The semiconductor nanocrystals can be isolated from the reaction mixture prior to formation of one or more overcoating layers.

In preferred embodiments, the chalcogen precursor is injected into, or rapidly added to, the metal precursor(s).

In the present invention described herein, an oxygen-treated tertiary phosphine chalcogenide can comprise liquid tertiary phosphine chalcogenide that is exposed to air or other gas including oxygen. Exposure can include, for example, bubbling air or other oxygen containing gas into the liquid tertiary phosphine chalcogenide, flowing air or other oxygen containing gas over the surface of the liquid, or other techniques readily ascertained by the skilled artisan. Preferably the air or other gas including oxygen to which the liquid tertiary phosphine chalcogenide is exposed is dry. In certain embodiments, such exposure is carried out at room temperature, e.g., without the application of heat. The addition of air or other gas including oxygen is carried out to convert at least a portion of the tertiary phosphine chalcogenide to a secondary phosphine chalcogenide. The addition of air or other gas including oxygen, however, should be stopped before all the secondary phosphine formed is converted into other chemical species. Examples of tertiary phosphines include, but are not limited to, trialkyl phosphines such as tri-n-octylphosphine, tri-n-butylphosphine, tri-aryl phosphines.

According to a certain aspect, a solution of a metal source is provided at a reaction temperature, such as by heating, after which a secondary phosphine chalcogenide or secondary phosphine chalcogenide precursor or oxygen-treated tertiary phosphine chalcogenide is rapidly added to the solution of the metal source whereupon nanocrystals including the metal and the chalcogenide form in a reaction mixture. The reaction is terminated resulting in nanocrystals of certain size. According to one aspect, the reaction is terminated according to methods known to those of skill in the art which may include termination by use of a chemical agent, termination by use of a temperature reduction, termination by use of isolation material or dilution of reactive ingredients to a point where the reactive ingredients are no longer effectively reactive. According to one aspect, the reaction is terminated by rapidly cooling the reaction mixture to a quenching temperature substantially below that of the reaction temperature. It is to be understood that different reaction temperatures may exist for different reaction mixtures. Likewise, it is to be understood that different quenching temperatures may exist for different reaction mixtures. Accordingly, reaction temperatures include those at which quantum dots may be created and quenching temperatures include those at which the quantum dot growing process is terminated or quenched resulting in quantum dots of desired size. Other techniques may be determined by the skilled artisan to be useful or desirable for terminating or quenching the reaction. Quantum dots present in the reaction vessel then may be isolated or recovered.

According to a certain aspect, a solution of a metal source is provided at a reaction temperature, such as by heating, after which a secondary phosphine chalcogenide or secondary phosphine chalcogenide precursor or oxygen-treated tertiary phosphine is rapidly added, such as by injection, into the solution of the metal source to form a reaction mixture whereupon the metal and the chalcogenide combine to form nanocrystals. Immediately after addition of the secondary phosphine chalcogenide is completed, the reaction mixture is rapidly cooled to a quenching temperature thereby terminating or quenching the growth of nanocrystals. According to certain aspect, the reaction, i.e. formation of nanocrystals, is terminated thereby resulting in nanocrystals of certain size by quenching methods known to those of skill in the art. According to one aspect, the reaction is terminated by rapidly cooling the reaction mixture to a temperature substantially below that of the reaction temperature. Quantum dots are then present in the reaction vessel and then may be isolated or recovered.

According to a certain aspect, quantum dots of certain desired size are created by selecting a certain initial reaction temperature of a solution of a metal source, followed by rapid addition, such as by injection, of a secondary phosphine chalcogenide or secondary phosphine chalcogenide precursor or oxygen-treated tertiary phosphine to produce a reaction mixture. Immediately after completion of the rapid addition of the secondary phosphine chalcogenide or secondary phosphine chalcogenide precursor or oxygen-treated tertiary phosphine, the reaction mixture is rapidly cooled to quenching temperature to stop or otherwise inhibit further nanocrystal growth. According to this aspect, a higher initial reaction temperature will produce quantum dots of larger diameter compared to a lower initial reaction temperature. In this manner, a method is provided of tuning quantum dot size by selecting an initial reaction temperature which is rapidly lowered to a quenching temperature. Without wishing to be bound by scientific theory, the higher the initial reaction temperature, the longer the reaction mixture is allowed to react, and accordingly, the longer the particles are allowed to grow before reaching a temperature at which the reaction is substantially or effectively terminated.

According to certain aspects, a secondary phosphine chalcogenide may be provided to the reaction mixture as a secondary phosphine chalcogenide or as a precursor to a secondary phosphine chalcogenide or as an oxygen treated tertiary phosphine chalcogenide. Suitable precursor compounds include tertiary phosphine chalcogenides which may be oxidized in the reaction mixture to produce secondary phosphine chalcogenides for use in the process of making quantum dots. Alternatively, tertiary phosphine chalcogenides may be oxidized prior to addition to a reaction mixture to produce secondary phosphine chalcogenides for use in the process of making quantum dots.

According to certain aspects, quantum dots may be made according to the present invention in the absence of amine compounds in the reaction mixture. According to this aspect, a reaction mixture is substantially free of amine compounds or substantially excludes amine compounds.

In certain embodiments, the preparation of semiconductor nanocrystals can include the presence of an amine. See, for example, U.S. Pat. No. 6,576,291 for "Preparation of Nanocrystallites" of Bawendi et al, issued 10 Jun. 2003, which is hereby incorporated herein by reference in its entirety.

According to certain aspects, quantum dots may be made according to the inventions described herein with ligands attached to the surface of the quantum dots. According to this aspect, ligand-providing compounds can be included into the reaction mixture used to produce the quantum dots. Such ligand-providing compounds include carboxylates, phosphonates, phosphonites and the like.

According to a certain aspect, quantum dots produced by the invention described herein can then be coated with one or more coatings including semiconductor materials. A coating layer (also referred to herein as an overcoating layer) can comprise one or more inorganic materials. A coating layer can comprise one or more semiconductor materials. A coating layer can comprise one or more different semiconductor materials. A coating layer can comprise more than one layer.

When multiple layers are included on the semiconductor nanocrystals, each layer can have a composition that is the same or different from that of an adjacent layer. When multiple layers are included on the semiconductor nanocrystals, each layer can have a composition that is same or different from that of any other layer.

An overcoating layer can have a thickness from about one to about ten monolayers. An overcoating layer can also have a thickness greater than ten monolayers.

More than one overcoating layer can be included on a core.

An overcoating layer can comprise a material having a band gap greater than the band gap of the core material.

An overcoating layer can comprise a material having a band gap less than the band gap of the core material.

The material selected for inclusion in an overcoating layer can be chosen so as to have an atomic spacing close to that of the "core" substrate.

The material selected for inclusion in an overcoating layer can be chosen so as to have the same crystal structure as that of the "core" substrate.

Examples of semiconductor nanocrystal (core)shell materials include, without limitation: red (e.g., (CdSe)CdZnS (core)shell), green (e.g., (CdZnSe)CdZnS (core)shell, etc.), and blue (e.g., (CdS)CdZnS (core)shell.

In accordance with a certain aspect of the present invention, a method is provided for increasing the yield of quantum dots using the invention described herein. For example, the method includes providing a solution of a metal source at a reaction temperature and to which a secondary phosphine chalcogenide or secondary phosphine chalcogenide precursor or oxygen-treated tertiary phosphine chalcogenide is rapidly added to the solution of the metal source whereupon nanocrystals including the metal and the chalcogenide form in a reaction mixture. The reaction is terminated resulting in nanocrystals of certain size.

In accordance with another aspect of the present invention, there is provided a method for increasing the yield of semiconductor nanocrystals comprising mixing a chalcogen source with an oxygen-treated tertiary phosphine to form a chalcogen precursor, forming a reaction mixture including the chalcogen precursor and one or more metal precursors, and heating the reaction mixture to form semiconductor nanocrystals comprising one or more metals and one or more chalcogens.

In certain embodiments, a yield increase of at least 2 times can be achieved.

Examples of metals include, but are not limited to, those from Groups 11, 12, and/or 14 of the Periodic Table.

In certain embodiments, the method comprises mixing a first solution formed by adding at least one chalcogen source to an oxygen-treated liquid tertiary phosphine with a second solution including at least one metal precursors to form a reaction mixture and heating the reaction mixture to form semiconductor nanocrystals comprising at least one metal and at least one chalcogen.

The above methods can further comprise forming one or more overcoating layers over at least a portion, and preferably all, of an outer surface of at least a portion of the semiconductor nanocrystals.

The semiconductor nanocrystals can be isolated from the reaction mixture prior to formation of one or more overcoating layers.

According to exemplary embodiments, quantum dots of a certain size are formed by combining a metal source or donor in a liquid medium at a reaction temperature with a secondary phosphine chalcogenide or secondary phosphine chalcogenide precursor compound or oxygen-treated tertiary phosphine chalcogenide to form a reaction mixture producing quantum dots including the metal source and the chalcogenide. After the metal source and the secondary phosphine chalcogenide or secondary phosphine chalcogenide precursor compound or oxygen-treated tertiary phosphine chalcogenide are combined to create quantum dots of desired size, the reaction is terminated or quenched, such as by cooling the reaction mixture to a quenching temperature at which the reaction substantially terminates and the particles precipitate out of solution and may be collected or isolated. In certain embodiments, a metal source can comprise one or more metal sources which can be the same or different. In certain embodiments, a chalcogenide source can comprise one or more chalcogenide sources which can be the same or different.

A reaction temperature is preferably sufficient for reacting one or more metal sources and one or more chalcogen sources to form a semiconductor material comprising one or more metals and one or more chalcogens.

According to aspects of the present disclosure, an exemplary reaction temperature is between about 125° C. and about 400° C., between about 150° C. and about 350° C., between about 175° C. and about 325° C., between about 200° C. and about 300° C., above about 150° C., above about 175° C., above about 200° C., above about 225° C., above about 250° C., above about 275° C., above about 300° C. and the like.

In certain embodiments, the reaction mixture can be heated at a temperature in a range from greater than 200° C. to a temperature at which at least one of the materials in the reaction mixture boils or decomposes.

In certain embodiments, the reaction temperature can be selected to achieve a predetermined particle size of the semiconductor nanocrystals.

In preparing semiconductor nanocrystals with an average diameter less than 3 nm, a heating temperature in a range of about 225 to about 270° C. can be preferred. For example, in preparing semiconductor nanocrystals comprising CdSe capable of emitting light with a peak emission at about 530 nm or less, a heating temperature of about 200 to about 240° C. can be desirable.

In preparing semiconductor nanocrystals with an average diameter 3 nm or greater, a heating temperature greater than 270° C. can be preferred. For example, in preparing semiconductor nanocrystals comprising CdSe capable of emitting light with a peak emission greater than 590 nm, a heating temperature in a range from about 270 to about 300° C. can be desirable.

Where, for example, the Group 11 or 12 metal precursor is the limiting reagent in the preparation of the semiconductor nanocrystals, in making larger size semiconductor nanocrystals (e.g., 3 nm or larger) at higher temperatures (e.g., 270° C. or higher, additional Group 11 and/or Group 12 precursor and/or additional ligand (if not derived from a solvent or reagent) may be required to prepare nanocrystals having the desired particle size and emission characteristics.

In preferred embodiments of the methods described herein, once all of the precursors are added together, the reaction is stopped or quenched to control the particle size of the nanocrystals formed.

Quenching can comprise removing any heat source (e.g., a heating mantle) and treating the reaction mixture with a partially frozen solvent bath. A partially frozen squalane bath is particularly useful for such purpose.

In certain embodiments, one or more solvents and/or other components can be included in the reaction mixture.

In certain embodiments, one or more of the metal precursor(s) can be included with one or more solvents and/or other components prior to being added together to form the reaction mixture.

In certain embodiments, one or more of the chalcogen sources can be included with one or more solvents and/or other components prior to being added together to form the reaction mixture.

In certain embodiments, the metal precursor can be added to the chalcogen precursor.

In certain embodiments, the chalcogen precursor can be added to the metal precursor.

In certain embodiments, the metal precursor can be included in a first solution that can further include one or more solvents and/or other components.

In certain embodiments, the chalcogen precursor can be included in a second solution that can further include one or more solvents and/or other components.

In certain embodiments, the reaction mixture can further include one or more additional solvents.

In certain embodiments, a quenching temperature is selected to be sufficient to slow, and preferably stop, further reaction of one or more metal sources and one or more chalcogen sources.

An exemplary quenching temperature at which the reaction produces particles is about 200° C. or below about 200° C. According to certain aspects of the present disclosure, a quenching temperature is substantially lower than a reaction temperature. An exemplary quenching temperature is between about 50° C. and about 150° C. lower than a given reaction temperature, between about 75° C. and about 125° C. lower than a given reaction temperature, or about 100° C. lower than a given reaction temperature. An exemplary quenching temperature is between about 175° C. and about 75° C., between about 150° C. and about 100° C., between about 125° C. and about 100° C., lower than about 150° C., lower than about 125° C., lower than about 100° C. and the like. An exemplary quenching temperature at which the reaction substantially terminates but the particles precipitate out of solution is about 100° C. or below about 100° C. The quantum dots are then isolated or recovered or purified prior to further processing.

In accordance with one aspect, the ratio of moles of secondary phosphine chalcogenide or secondary phosphine chalcogenide precursor compound or oxygen-treated tertiary phosphine chalcogenide to moles of metal in the reaction mixture is greater than or equal to one.

According to an exemplary embodiment including a metal precursor comprising cadmium and a secondary phosphine chalcogenide or secondary phosphine chalcogenide precursor or oxygen-treated tertiary phosphine chalcogenide comprising selenium, the precursors are selected such that upon their combination in a liquid medium at a temperature of above about 200° C., the metal precursor and the chalcogenide react to form quantum dots of metal and chalcogenide having a peak absorbance between about 420 nm and about 480 nm. According to one aspect, the quantum dots of peak absorbance between about 420 nm and about 480 nm are formed rapidly upon combination of the metal precursor and the chalcogenide in the reaction vessel. According to one aspect, the metal precursor is in a reaction vessel in a liquid medium at a temperature of above about 200° C. The secondary phosphine chalcogenide or secondary phosphine chalcogenide precursor or oxygen-treated tertiary phosphine chalcogenide is rapidly added to the reaction vessel and the liquid medium whereupon quantum dots including the metal and the chalcogenide of peak absorbance between about 420 nm and about 480 nm are formed upon the rapid addition of the chalcogenide. After rapid addition of the chalcogenide is completed, the reaction vessel is immediately cooled to a temperature of about 100° C. or below so as to substantially terminate the reaction.

According to other embodiments including a metal precursor comprising cadmium and a secondary phosphine chalcogenide or secondary phosphine chalcogenide precursor or oxygen-treated tertiary phosphine chalcogenide comprising selenium, the precursors are selected such that upon their combination in a liquid medium at a temperature of above about 200° C., the metal precursor and the chalcogenide react to form quantum dots of metal and chalcogenide having a peak absorbance above 480 nm, as shown in the Examples.

Exemplary quantum dots according to the present disclosure include those having metal from the metal precursors and chalcogenide from the secondary phosphine chalcogenide or secondary phosphine chalcogenide precursor compound or oxygen-treated tertiary phosphine chalcogenide. Accordingly, exemplary quantum dots include those of the formula MX, where M is a metal from a metal donor and X is a compound from an X donor which is capable of reacting with the metal donor to form a material with the general formula MX. In certain embodiments, the M donor and the X donor can be moieties within the same molecule.

The M donor or metal precursor can be an inorganic compound, an organometallic compound, or elemental metal.

Metal precursor can constitute a wide range of substances, such as a metal oxide, a metal carbonate, a metal bicarbonate, a metal sulfate, a metal sulfite, a metal phosphate, metal phosphite, a metal phosphonate, metal arsonate, metal hydroxide, metal diketonate, such as metal acetylacetonate, a metal halide, a metal carboxylate, a metal alkoxide, a metal thiolate, a metal amide, a metal imide, a metal alkyl, a metal aryl, a metal coordination complex, a metal solvate, a metal salt, and the like.

A metal precursor can comprise, for example, a Group 11 or 12 metal in elemental form or a chemical compound or complex that is a source of the Group 11 or 12 metal. Examples of Group 11 or 12 metal precursors include organometallic reagents, such as, for example, but not limited to, dimethyl cadmium.

In certain embodiments, the Group 11 or 12 precursor comprises a metal oxide, such as, for example, but not limited to, cadmium oxide.

In certain embodiments, the Group 11 or 12 metal precursor comprises an inorganic compound, such as, for example, but not limited to, a metal salt (e.g., a metal halide, metal carboxylate, metal carbonate, metal phosphonate, metal arsonate, metal hydroxide, or metal diketonate, such as a metal acetylacetonate). Examples of cadmium salts include, but are not limited to, cadmium acetylacetonate, cadmium iodide, cadmium bromide, cadmium hydroxide, cadmium carbonate, cadmium acetate).

Examples of metals include cadmium, zinc, magnesium, mercury, aluminum, gallium, indium, thallium, or mixtures. Other metals that can react to form a semiconductor comprising a metal chalcogenide can also be used.

Exemplary metal precursors include dimethylcadmium and cadmium oleate. For example, an M donor or metal precursor can comprise cadmium, zinc, magnesium, mercury, aluminum, gallium, indium, thallium, or mixtures thereof.

The X donor can comprise a chalcogenide donor where X is a chalcogenide including oxygen, sulfur, selenium, or tellurium, or mixtures thereof. Suitable chalcogenide donors include reactive chalcogenide source, such as highly reactive chalcogenide sources such as $(TMS)_2Se$, $(TMS)_2S$, $H_2S$, chalcogenide mixtures such as octadecene-Se, (ODE/Se), octadecene-S (ODE/s), amine-Se, amine-S, oxygen-treated tertiary phosphine chalcogenide and mixtures thereof and secondary phosphine chalcogenides include a secondary phosphine sulfide, a secondary phosphine selenide, a secondary phosphine telluride, or a secondary phosphine oxide, dialkyl phosphine chalcogenides such as diisobutylphosphine selenides, diisobutylphosphine sulfides, diphenylphosphine selenides, diphenylphosphine sulfides or mixtures thereof or mixtures of any of the above.

Examples of materials suitable for use as quantum dot cores include, but are not limited to, ZnO, ZnS, ZnSe, ZnTe, CdO, CdS, CdSe, CdTe, MgS, MgSe, GaSe, HgO, HgS, HgSe, HgTe, PbO, PbS, PbSe, PbTe, an alloy including any of the foregoing, and/or a mixture including any of the foregoing, including ternary and quaternary mixtures or alloys.

A semiconductor nanocrystal (including a semiconductor nanocrystal core of a core/shell semiconductor nanocrystal) can comprise one or more semiconductor materials at least one of which comprises at least one metal and at least one chalcogen. Examples of semiconductor materials include, but are not limited to, Group II-VI compounds (e.g., binary, ternary, and quaternary compositions), Group III-VI compounds (e.g., binary, ternary, and quaternary compositions), Group IV-VI compounds (e.g., binary, ternary, and quaternary compositions), Group compounds (e.g., binary, ternary, and quaternary compositions), Group II-IV-VI compounds (e.g., binary, ternary, and quaternary compositions), and alloys including any of the foregoing, and/or a mixture including any of the foregoing. Semiconductor nanocrystals can also comprise one or more semiconductor materials that comprise ternary and quaternary alloys that include one or more of the foregoing compounds.

As discussed herein, a semiconductor nanocrystal on which a coating is grown in accordance with the present invention can comprise one or more shells over a surface of the core. A shell typically comprises a semiconductor material. A shell can comprise a Group II-VI compound, Group II-V compound, Group III-VI compound, Group III-V compound, Group IV-VI compound, Group compound, Group II-IV-VI compound, and Group II-IV-V compound, Non-limiting examples of such semiconductor materials include, but are not limited to, ZnS, ZnSe, ZnTe, CdS, CdSe, CdTe, HgS, HgSe, HgTe, AlN, AlP, AlAs, AlSb, GaN, GaP, GaAs, GaSb, GaSe, InN, InP, InAs, InSb, TlN, TlP, TlAs, TlSb, PbS, PbSe, PbTe, a mixture including any one or more of the foregoing, an alloy including any one or more of the foregoing, etc. In certain embodiments, a shell can comprise a Group IV element.

According to an exemplary embodiment, the liquid medium includes solvents such as coordinating solvents. Alternatively, non-coordinating solvents can also be used in certain applications. A coordinating solvent is a compound having a donor lone pair that, for example, a lone electron pair available to coordinate to a surface of the growing quantum dot (including, e.g., a semiconductor nanocrystal). Solvent coordination can stabilize the growing quantum dot. Examples of coordinating solvents include alkyl phosphines, alkyl phosphine oxides, alkyl phosphonic acids, or alkyl phosphinic acids, however, other coordinating solvents, such as pyridines, furans, and amines may also be suitable for the quantum dot (e.g., semiconductor nanocrystal) production. Additional examples of suitable coordinating solvents include pyridine, tri-n-octyl phosphine (TOP), tri-n-octyl phosphine oxide (TOPO) and trishydroxylpropylphosphine (tHPP), tributylphosphine, tri(dodecyl)phosphine, dibutylphosphite, tributyl phosphite, trioctadecyl phosphite, trilauryl phosphite, tris(tridecyl) phosphite, triisodecyl phosphite, bis(2-ethylhexyl)phosphate, tris(tridecyl) phosphate, hexadecylamine, oleylamine, octadecylamine, bis(2-ethylhexyl) amine, octylamine, dioctylamine, trioctylamine, dodecylamine/laurylamine, didodecylamine tridodecylamine, hexadecylamine, dioctadecylamine, trioctadecylamine, phenylphosphonic acid, hexylphosphonic acid, tetradecylphosphonic acid, octylphosphonic acid, octadecylphosphonic acid, propylenediphosphonic acid, phenylphosphonic acid, aminohexylphosphonic acid, dioctyl ether, diphenyl ether, methyl myristate, octyl octanoate, and hexyl octanoate. In certain embodiments, technical grade TOPO can be used.

Examples of suitable non-coordinating solvents include, but are not limited to, squalane, octadecane, and saturated hydrocarbon solvents.

According to one aspect, the solvent is at a reaction temperature of above about 200° C. According to an additional aspect the solvent is at a reaction temperature of between about 200° C. and 400° C. According to one aspect, the metal precursor and the secondary phosphine chalcogenide or secondary phosphine chalcogenide precursor compound or oxygen-treated tertiary phosphine chalcogenide are introduced into a reaction vessel and the solvent at substantially the same time. Alternatively, the metal precursor is in the solvent in the reaction vessel and the chalcogenide is added to the solvent in the reaction vessel.

According to one aspect, the metal and the chalcogenide react together in a colloidal growth process to produce quantum dots. According to an exemplary aspect, the chalcogenide is added to the solvent by injection. For a given volume of secondary phosphine chalcogenide or secondary phosphine chalcogenide precursor or oxygen-treated tertiary phosphine chalcogenide, rapid addition such as by injection includes an addition accomplished in between about 0.5 seconds and about 60 seconds, between about 5 seconds and about 50 seconds, between about 10 seconds and about 30 seconds, between about 1 second to about 3 seconds, between about 1 second to about 2 seconds and the like.

Rapid injection methods and devices are known to those of ordinary skill in the art and include manual injection such as by syringe or automated injection such as by pneumatic pressure operating on a container or vessel including the chalcogenide reactant. Without wishing to be bound by scientific theory, the injection of the chalcogenide permits discrete nucleation and results in the growth of quantum dots including the metal and the chalcogenide. A first absorbance peak of the nucleated quantum dots will be dependent upon the particular semiconductor being formed and the corresponding band-gap of the semiconductor. For example, an exemplary first absorbance peak for a CdSe nucleated nanocrystal may be between about 420 nm and 480 nm. According to one aspect, CdSe quantum dots having a first absorbance peak between about 420 nm and 480 nm are formed within about 0.5 seconds to about 10 seconds after injection of the chalcogenide into the solvent including the metal precursor. According to one aspect, CdSe quantum dots having a first absorbance peak between about 420 nm and 480 nm are formed within about 1 second seconds to about 8 seconds, within about 1 second to about 5 seconds or immediately after injection of the chalcogenide into the solvent including the metal precursor.

For example, after initiation of the reaction between the predetermined precursor(s), the reaction mixture can be gently heated to grow and anneal the semiconductor nanocrystal.

Both the average size and the size distribution of the semiconductor nanocrystals in a sample are dependent on the growth temperature, as discussed above. The growth temperature necessary to maintain steady growth increases with increasing average semiconductor nanocrystal size.

After quantum dots are formed in the reaction vessel, the reaction may be terminated, or quenched by, for example, cooling the reaction mixture. According to one aspect, the reaction vessel is cooled to a temperature of below about 100° C. or lower using a suitable heat sink. According to one aspect, the reaction vessel is submerged in a cooling bath such that rapid cooling of the reaction mixture is achieved. Cooling baths according to the present disclosure include any suitable cooling bath medium. Exemplary cooling baths include water or other fluids which can be maintained at low temperatures suitable for rapidly cooling reaction media and include a bath of squalane cooled with liquid nitrogen. The reaction vessel can then be contacted with the bath and the temperature of the reaction vessel is lowered to a temperature at which the reaction terminates.

According to one aspect, the size of the quantum dots produced as a result of rapid injection followed by immediate and rapid cooling may be dependent upon the initial reaction temperature of the liquid solvent. For example, it is contemplated that a higher initial reaction temperature may produce larger quantum dots insofar as the time it takes to rapidly cool the reaction vessel to a temperature of below about 100° C. or lower will be longer when the initial reaction temperature is higher. According to this aspect, a method is provided for producing quantum dots of a particular size by selecting an initial reaction temperature followed by rapid injection and then immediate and rapid cooling of the reaction mixture to a temperature at which the reaction terminates.

According to one aspect, the quantum dots produced as a result of rapid injection and rapid cooling are isolated or recovered, for example by precipitation with additional of butanol and methanol in a ratio of 1 to 1.5 to 0.5 v/v/v quantum dot stock solution to butanol to methanol, and then placed into a non-coordinating solvent in a reaction vessel at a temperature of between about 200° C. to about 250° C., between about 210° C. to about 240° C. or between about 220° C. to about 240° C. Non-coordinating solvents include 1-decene, 1-dodecene, 1-tetradecene, 1-hexadecene, 1-octadecene, 1-icosene and 1-docosene and the like.

According to an exemplary aspect, quantum dot core particles are made by reaction of Cd(ODPA) and diisobutylphosphine selenide, which is a highly reactive selenium precursor, in a reaction medium. Prior to the point at which the quantum dots begin to react together in a process called Ostwald ripening or broadening, the reaction is terminated such as by rapidly cooling the reaction medium. According to one aspect, prior to the point at which the quantum dots begin to react together in a process called Ostwald ripening or broadening, the reaction medium is rapidly cooled and the quantum dots are "crashed" or precipitated or separated out of the reaction medium.

Resulting quantum dots are members of a population of quantum dots. As a result of the discrete nucleation and rapid cooling described herein, the population of quantum dots that can be obtained has a narrow, monodisperse distribution of diameters. The monodisperse distribution of diameters can also be referred to as a size. Preferably, a monodisperse population of particles includes a population of particles wherein at least about 60% of the particles in the population fall within a specified particle size range. A population of monodisperse particles preferably deviate less than 15% rms (root-mean-square) in diameter and more preferably less than 10% rms and most preferably less than 5% rms.

Quantum dots of the present invention may be between about 2.2 nm and about 2.6 nm in diameter. In general, quantum dots according to the present disclosure can have an average particle size in a range from about 1 to about 1000 nanometers (nm), and preferably in a range from about 1 to about 100 nm. In certain embodiments, quantum dots have an average particle size in a range from about 1 to about 20 nm (e.g., such as about 2, 3, 4, 5, 6, 7, 8, 9, 10, 11, 12, 13, 14, 15, 16, 17, 18, 19, or 20 nm). In certain embodiments, quantum dots have an average particle size in a range from about 1 nm to about 20 nm or about 1 nm to about 10 nm. Quantum dots can have an average diameter less than about 150 Angstroms (Å). In certain embodiments, quantum dots having an average diameter in a range from about 12 to about 150 Å can be particularly desirable. However, depending upon the composition, structure, and desired emission wavelength of the quantum dot, the average diameter may be outside of these ranges.

In certain embodiments, quantum dots can include a core having one or more semiconductor materials and a shell comprising one or more semiconductor materials, wherein the shell is disposed over at least a portion, and preferably all, of the outer surface of the core. A quantum dot including a core and shell is also referred to as a "core/shell" structure.

As discussed above, a shell can be a semiconductor material. The shell can comprise an overcoat including one or more semiconductor materials on a surface of the core. Examples of semiconductor materials that can be included in a shell include, but are not limited to, a Group IV element, a Group II-VI compound, a Group II-V compound, a Group III-VI compound, a Group III-V compound, a Group IV-VI compound, a Group compound, a Group II-IV-VI compound, a Group II-IV-V compound, alloys including any of the foregoing, and/or mixtures including any of the foregoing, including ternary and quaternary mixtures or alloys. Examples include, but are not limited to, ZnO, ZnS, ZnSe, ZnTe, CdO, CdS, CdSe, CdTe, MgS, MgSe, GaAs, GaN, GaP, GaSe, GaSb, HgO, HgS, HgSe, HgTe, InAs, InN, InP, InSb, AlAs, AlN, AlP, AlSb, TIN, TIP, TlAs, TlSb, PbO, PbS, PbSe, PbTe, Ge, Si, an alloy including any of the foregoing, and/or a mixture including any of the foregoing. For example, ZnS, ZnSe or CdS overcoatings can be grown on CdSe or CdTe semiconductor nanocrystals.

As discussed above, in a core/shell quantum dot, the shell or overcoating may comprise one or more layers. Preferably, the overcoating has a thickness from about one to about ten monolayers. An overcoating can also have a thickness greater than ten monolayers. In certain embodiments, more than one overcoating can be included on a core.

In certain embodiments, the surrounding "shell" material can have a band gap greater than the band gap of the core material. In certain other embodiments, the surrounding shell material can have a band gap less than the band gap of the core material.

In certain embodiments, the shell can be chosen so as to have an atomic spacing close to that of the "core" substrate. In certain other embodiments, the shell and core materials can have the same crystal structure.

Examples of quantum dot (e.g., semiconductor nanocrystal) (core)shell materials include, without limitation: red (e.g., (CdSe)CdZnS (core)shell), green (e.g., (CdZnSe) CdZnS (core)shell, etc.), and blue (e.g., (CdS)CdZnS (core) shell.

Forming an overcoating layer can comprise including semiconductor nanocrystal cores in a liquid medium and adding precursors for forming a desired overcoating material and converting the precursors into such desired overcoating material. Preferably the semiconductor nanocrystal cores comprise a substantially monodisperse core population.

For example, when an overcoating layer comprises a semiconductor material, overcoating precursors are converted into the semiconductor material by heating at a temperature sufficient to convert the precursor into the semiconductor material. Preferably the temperature is insufficient to substantially alter the monodispersity of the core population. Solvent of other liquid media described herein for preparation of the semiconductor nanocrystal core can be used in an overcoating step. Other liquid media for use in preparation the core and/or shell can be readily identified by one of ordinary skill in the relevant art.

A semiconductor nanocrystal surrounded by a semiconductor shell is also referred to as a "core/shell" structure.

Examples of materials for inclusion in an overcoating layer can include a Group IV element, a Group II-VI compound, a Group II-V compound, a Group III-VI compound, a Group III-V compound, a Group IV-VI compound, a Group I-III-VI compound, a Group II-IV-VI compound, a Group II-IV-V compound, alloys including any of the foregoing, and/or mixtures including any of the foregoing, including ternary and quaternary mixtures or alloys. Examples include, but are not limited to, ZnO, ZnS, ZnSe, ZnTe, CdO, CdS, CdSe, CdTe, MgS, MgSe, GaAs, GaN, GaP, GaSe, GaSb, HgO, HgS, HgSe, HgTe, InAs, InN, InP, InSb, AlAs, AlN, AlP, AlSb, TlN, TlP, TlAs, TlSb, PbO, PbS, PbSe, PbTe, Ge, Si, an alloy including any of the foregoing, and/or a mixture including any of the foregoing.

An example of an overcoating process is described, for example, in U.S. Pat. No. 6,322,901 incorporated herein in its entirety by reference. By adjusting the temperature of the reaction mixture during overcoating and monitoring the absorption spectrum of the core, overcoated materials having high emission quantum efficiencies (EQE) and narrow size distributions can be obtained.

Other overcoating processes can also be used.

In accordance with yet another aspect of the present invention, there is provided a method for overcoating semiconductor nanocrystals. The method comprises forming a reaction mixture including at least one secondary phospine and at least one metal source in the presence of semiconductor nanocrystals to form a reaction mixture and heating the reaction mixture to form an overcoating comprising at least one metal and at least one chalcogen on at least a portion of an outer surface of at least a portion of the semiconductor nanocrystals included in the reaction mixture. According to certain aspects, the secondary phosphine chalcogenide may be a secondary phosphine sulfide, a secondary phosphine selenide, a secondary phosphine telluride, or a secondary phosphine oxide.

In accordance with another aspect of the present invention there is provided a method for overcoating semiconductor nanocrystals. The method comprises mixing at least one chalcogen source with an oxygen-treated tertiary phosphine to form a chalcogen precursor, forming a reaction mixture including the chalcogen precursor and at least one metal precursor in the presence of semiconductor nanocrystals to form a reaction mixture and heating the reaction mixture to form an overcoating comprising at least one metal and at least one chalcogen on at least a portion of an outer surface of at least a portion of the semiconductor nanocrystals included in the reaction mixture.

In certain embodiments, a metal precursor can comprise a Group 11 metal precursor, a Group 12 metal precursor, a Group 13 metal precursor, a Group 14 metal precursor, or other metal precursor.

In certain embodiments of the overcoating methods, the chalcogen precursor(s) and metal precursor(s) can be added in a controlled manner. For example, the precursors can be added by slow infusion of the at least one chalcogen precursor to the at least one metal precursor or with (separately or as a mixture) the at least one metal precursor.

Examples of such semiconductor nanocrystals that can be overcoated by the overcoating of the invention include, but are not limited to, those comprising a Group IV element, a Group II-VI compound, a Group II-V compound, a Group III-VI compound, a Group III-V compound, a Group IV-VI compound, a Group I-III-VI compound, a Group II-IV-VI compound, a Group II-IV-V compound, an alloy including any of the foregoing, and/or a mixture including any of the foregoing, including ternary and quaternary mixtures or alloys. A non-limiting list of examples include ZnO, ZnS, ZnSe, ZnTe, CdO, CdS, CdSe, CdTe, MgS, MgSe, GaAs, GaN, GaP, GaSe, GaSb, HgO, HgS, HgSe, HgTe, InAs, InN, InP, InSb, AlAs, AlN, AlP, AlSb, TlN, TlP, TlAs, TlSb, PbO, PbS, PbSe, PbTe, Ge, Si, an alloy including any of the foregoing, and/or a mixture including any of the foregoing, including ternary and quaternary mixtures or alloys.

A metal can comprise a Group 11 metal. Group 11 metals include, but are not limited to, copper (Cu), silver (Ag), and gold (Au). (Group 11 is also referred to as Group IB of the Periodic Table, the Arabic numeral group nomenclature being that recommended by the International Union of Pure and Applied Chemistry (IUPAC) to replace the traditional Roman numeral names of the groups of the Periodic Table of Elements.)

A metal can comprise a Group 12 metal. Group 12 metals include, but are not limited to, zinc (Zn), cadmium (Cd), and mercury (Hg). (Group 12 is also referred to as Group IIB of the Periodic Table of Elements.)

A metal can comprise a Group 13 metal. Group 13 metals include, but are not limited to, gallium (Ga), indium (In), and thallium (Tl). (Group 13 is also referred to as Group IIIA of the Periodic Table of Elements.)

A metal can comprise a Group 14 metal. Group 14 metals include, but are not limited to, tin (Sn), and lead (Pb). (Group 14 is also referred to as Group IVA of the Periodic Table of Elements.)

Chalcogens include, but are not limited to, oxygen, sulfur, selenium and tellurium. (The chalcogens are also referred to as Group 16 or Group VIA of the Periodic Table.)

The narrow size distribution of the quantum dots (including, e.g., semiconductor nanocrystals) allows the possibility of light emission in narrow spectral widths. Monodisperse semiconductor nanocrystals have been described in detail in Murray et al. Am. Chem. Soc., 115:8706 (1993)) hereby incorporated herein by reference in its entirety.

The process of controlled growth and annealing of the semiconductor nanocrystals in a coordinating solvent or in the presence of ligands that follows nucleation can also result in uniform surface derivatization and regular core structures. As the size distribution sharpens, the temperature can be controlled to maintain steady growth. By adding more metal-precursor and/or chalcogen precursor, the growth period can be shortened.

Size distribution during the reaction process can be estimated by monitoring the absorption or emission line widths of the particles. Modification of the reaction temperature in response to changes in the absorption spectrum of the particles allows the maintenance of a sharp particle size distribution during growth.

Reactants can be added to the nucleation solution during crystal growth to grow larger crystals. For example, for CdSe and CdTe, by stopping growth at a particular semiconductor nanocrystal average diameter and choosing the proper composition of the semiconducting material, the emission spectra of the semiconductor nanocrystals can be tuned continuously over the wavelength range of 300 nm to 5 microns, or from 400 nm to 800 nm.

The particle size distribution of the quantum dots (including, e.g., semiconductor nanocrystals) can be further refined by size selective precipitation with a poor solvent for the quantum dots, such as methanol/butanol. For example, quantum dots can be dispersed in a solution of 10% butanol in hexane. Methanol can be added dropwise to this stirring solution until opalescence persists. Separation of supernatant and flocculate by centrifugation produces a precipitate enriched with the largest crystallites in the sample. This procedure can be repeated until no further sharpening of the optical absorption spectrum is noted. Size-selective precipitation can be carried out in a variety of solvent/nonsolvent pairs, including pyridine/hexane and chloroform/methanol. The size-selected quantum dot (e.g., semiconductor nanocrystal) population preferably has no more than a 15% rms deviation from mean diameter, more preferably 10% rms deviation or less, and most preferably 5% rms deviation or less.

According to one aspect of the present disclosure, quantum dots of the present invention can include ligands attached thereto. Examples of ligands include aliphatic ligands. Such aliphatic ligands promote adhesion with a carrier particle. Such aliphatic ligands promote solubility or dispersability of the quantum dots bound to the carrier particles in a curable or polymerizable matrix material. According to one aspect, exemplary ligands include oleic acid ligands and octadecylphosphonic acid ("ODPA") ligands.

Ligands can be derived from a coordinating solvent that may be included in the reaction mixture during the growth process. Alternatively, ligands can be added to the reaction mixture or ligands can be derived from a reagent or precursor included in the reaction mixture for synthesizing the quantum dots. In certain embodiments, quantum dots can include more than one type of ligand attached to an outer surface.

A quantum dot surface that includes ligands derived from the growth process or otherwise can be modified by repeated exposure to an excess of a competing ligand group (including, e.g., but not limited to, coordinating group) to exchange out the initial or native surface ligands, and/or form an overlayer.

For example, a dispersion of capped quantum dots can be treated with a coordinating organic compound, such as pyridine, to produce crystallites which disperse readily in pyridine, methanol, and aromatics but no longer disperse in aliphatic solvents. Such a surface exchange process can be carried out with any compound capable of coordinating to or bonding with the outer surface of the nanoparticle, including, for example, but not limited to, phosphines, thiols, amines and phosphates.

For example, a quantum dot can be exposed to short chain polymers which exhibit an affinity for the surface and which terminate in a moiety having an affinity for a suspension or dispersion medium, such as a curable matrix material. Such affinity improves the stability of the suspension and discourages flocculation of the quantum dot.

Examples of additional ligands include fatty acids, long chain fatty acids such as oleic acid, alkyl phosphines, alkyl phosphine oxides, alkyl phosphonic acids, alkyl phosphinic acids, pyridines, furans, and amines. More specific examples include, but are not limited to, pyridine, tri-n-octyl phosphine (TOP), tri-n-octyl phosphine oxide (TOPO), tris-hydroxylpropylphosphine (tHPP) and octadecylphosphonic acid ("ODPA"). Technical grade TOPO can be used.

Suitable coordinating ligands can be purchased commercially or prepared by ordinary synthetic organic techniques, for example, as described in J. March, Advanced Organic Chemistry, which is incorporated herein by reference in its entirety.

In certain embodiments, organic ligands can be useful in facilitating large area, non-epitaxial deposition of highly stable inorganic nanocrystals within a device.

Other ligands are described in U.S. patent application Ser. No. 10/641,292 for "Stabilized Semiconductor Nanocrystals", filed 15 Aug. 2003, which is hereby incorporated herein by reference in its entirety.

Semiconductor nanocrystals are preferably prepared and handled, and the methods described herein after preferably carried out, in a controlled (oxygen-free and moisture-free) environment, preventing the quenching of luminescence.

The emission from a quantum dot capable of emitting light can be a narrow Gaussian emission band that can be tuned through the complete wavelength range of the ultraviolet, visible, or infra-red regions of the spectrum by varying the size of the quantum dot, the composition of the quantum dot, or both. For example, a semiconductor nanocrystal comprising CdSe can be tuned in the visible region; a semiconductor nanocrystal comprising InAs can be tuned in the infra-red region. The narrow size distribution of a population of quantum dots capable of emitting light can result in emission of light in a narrow spectral range. The population can be monodisperse and preferably exhibits less than a 15% rms (root-mean-square) deviation in diameter of such quantum dots, more preferably less than 10%, most preferably less than 5%. Spectral emissions in a narrow range of no greater than about 75 nm, preferably no greater than about 60 nm, more preferably no greater than about 40 nm, and most preferably no greater than about 30 nm full width at half max (FWHM) for such quantum dots that emit in the visible can be observed. IR-emitting quantum dots can have a FWHM of no greater than 150 nm, or no greater than 100 nm. Expressed in terms of the energy of the emission, the emission can have a FWHM of no greater than 0.05 eV, or no greater than 0.03 eV. The breadth of the emission decreases as the dispersity of the light-emitting quantum dot diameters decreases.

Quantum dots can have emission quantum efficiencies such as between 0% to greater than 95%, for example in solution, such as greater than 10%, 20%, 30%, 40%, 50%, 60%, 70%, 80%, or 90%.

Quantum dots produced according to the present invention may be used in various applications. According to one aspect, quantum dots produced according to the methods described herein may be used in photoluminescent (PL) applications where quantum dot materials are excited optically and the optical excitation is downconverted via emission from the QDs. According to this aspect, exemplary applications include devices or systems where an LED light source is used, for example solid-state lighting, LED Backlights (LED-BLU) Liquid Crystal Displays (LCD) and the like. According to an additional aspect, quantum dots produced according to the present invention may be used in a device or system where a light source is downconverted to other wavelengths (e.g. solar concentrators or downconverters where sunlight is converted to specific wavelengths tuned to highest efficiency window of the solar cells used in the system. Additional applications include plasma based systems where high energy plasma emission can excite a quantum dot downconverter, taggants, bio-labeling or imaging application, and barcoding or security/covert labeling applications. According to an additional aspect, quantum dots produced according to the present invention may be used in electroluminescent (EL) applications where quantum dots are excited electrically and the excitation results in emission from the quantum dots.

According to this aspect, exemplary applications include direct charge injection into the quantum dots generating quantum dot excited states and subsequent quantum dot emission, energy transfer from other semiconductor materials within the device to the quantum dots, generating an excited state and subsequent quantum dot emission and the like. According to an additional aspect, quantum dots produced according to the present invention may be used in photovoltaic (PV) applications where the quantum dot materials are excited optically and the excitation results in current generation and/or a voltage due to carrier extraction from the quantum dots.

Additional information that may be useful in connection with the present disclosure and the inventions described herein is included in International Application No. PCT/US2009/002796 of Coe-Sullivan et al, filed 6 May 2009, entitled "Optical Components, Systems Including An Optical Component, And Devices"; International Application No. PCT/US2009/002789 of Coe-Sullivan et al, filed 6 May 2009, entitled: "Solid State Lighting Devices Including Quantum Confined Semiconductor Nanoparticles, An Optical Component For A Solid State Light Device, And Methods"; U.S. patent application Ser. No. 12/283,609 of Coe-Sullivan et al, filed 12 Sep. 2008 entitled "Compositions, Optical Component, System Including An Optical Component, Devices, And Other Products"; International Application No. PCT/US2008/10651 of Breen et al, filed 12 Sep. 2008 entitled "Functionalized Nanoparticles And Method"; and International Application No. PCT/US2007/024320 of Clough et al, filed 21 Nov. 2007, entitled "Nanocrystals Including A Group IIIa Element And A Group Va Element, Method, Composition, Device And Other Products"; U.S. application 61/486,748 filed May 16, 2011 entitled "Method for Preparing Semiconductor Nanocrystals", International Application No. PCT/US2009/004345 of Breen et al, filed 28 Jul. 2009 entitled "Nanoparticle Including Multi-Functional Ligand And Method"; and International Application No. PCT/US2007/024320 of Clough et al, filed 21 Nov. 2007, entitled "Nanocrystals Including A Group Ina Element And A Group Va Element, Method, Composition, Device And Other Products, each of the foregoing being hereby incorporated herein by reference in its entirety.

The present invention will be further clarified by the following examples, which are intended to be exemplary of the present invention.

Example I

Comparison of the Effect of Initial Reaction Temperature on the Size of Semiconductor Nanocrystals Synthesis of CdSe Cores:

45.94 mmol of cadmium acetate was dissolved in 669.55 mmol of tri-n-octylphosphine at 100° C. in a 250 mL 3-neck round-bottom flask and then dried and degassed for one hour. 814.69 mmol of trioctylphosphine oxide and 104.85 mmol of octadecylphosphonic acid were added to a 0.5 L stainless steel reactor and dried and degassed at 140° C. for one hour. After degassing, the Cd solution was added to the reactor containing the oxide/acid and the mixture was heated to 270° C. under nitrogen. Once the temperature reached 270° C., the heating mantle was removed from the reactor and 139.9 mmol of diisobutylphosphine selenide (DIBP-Se) dissolved in 105 mL of 1-Dodecyl-2-pyrrolidinone (NDP) (1.5 M DIBP-Se) was then rapidly injected. The reactor was then immediately submerged in partially frozen (via liquid nitrogen) squalane bath rapidly reducing the temperature of the reaction to below 100° C. The first absorption peak of the nanocrystals was 454 nm. The CdSe cores were precipitated out of the growth solution inside a nitrogen atmosphere glovebox by adding a 3:1 mixture of methanol and isopropanol. The isolated cores were then dissolved in hexane and used to make core-shell materials.

Synthesis of CdSe Cores:

45.94 mmol of cadmium acetate was dissolved in 669.55 mmol of tri-n-octylphosphine at 100° C. in a 250 mL 3-neck round-bottom flask and then dried and degassed for one hour. 814.69 mmol of trioctylphosphine oxide and 104.85 mmol of octadecylphosphonic acid were added to a 0.5 L stainless steel reactor and dried and degassed at 140° C. for one hour. After degassing, the Cd solution was added to the reactor containing the oxide/acid and the mixture was heated to 310° C. under nitrogen. Once the temperature reached 310° C., the heating mantle was removed from the reactor and 139.9 mmol of diisobutylphosphine selenide (DIBP-Se) dissolved in 105 mL of 1-Dodecyl-2-pyrrolidinone (NDP) (1.5 M DIBP-Se) was then rapidly injected. The reactor was then immediately submerged in partially frozen (via liquid nitrogen) squalane bath rapidly reducing the temperature of the reaction to below 100° C. The first absorption peak of the nanocrystals was 480 nm. The CdSe cores were precipitated out of the growth solution inside a nitrogen atmosphere glovebox by adding a 3:1 mixture of methanol and isopropanol. The isolated cores were then dissolved in hexane and used to make core-shell materials.

Synthesis of CdSe Cores:

45.94 mmol of cadmium acetate was dissolved in 669.55 mmol of tri-n-octylphosphine at 100° C. in a 250 mL 3-neck round-bottom flask and then dried and degassed for one hour. 814.69 mmol of trioctylphosphine oxide and 104.85 mmol of octadecylphosphonic acid were added to a 0.5 L stainless steel reactor and dried and degassed at 140° C. for one hour. After degassing, the Cd solution was added to the reactor containing the oxide/acid and the mixture was heated to 320° C. under nitrogen. Once the temperature reached 320° C., the heating mantle was removed from the reactor and 139.9 mmol of diisobutylphosphine selenide (DIBP-Se) dissolved in 105 mL of 1-Dodecyl-2-pyrrolidinone (NDP) (1.5 M DIBP-Se) was then rapidly injected. The reactor was then immediately submerged in partially frozen (via liquid nitrogen) squalane bath rapidly reducing the temperature of the reaction to below 100° C. The first absorption peak of the nanocrystals was 492 nm. The CdSe cores were precipitated out of the growth solution inside a nitrogen atmosphere glovebox by adding a 3:1 mixture of methanol and isopropanol. The isolated cores were then dissolved in hexane and used to make core-shell materials.

As indicated above, a higher the initial reaction temperature produced a longer first absorption peak of the quantum dot such as a more red first absorption peak quantum dot. For example, an initial reaction temperature of 320° C. produced quantum dots with a first absorption peak of 492 nm. An initial reaction temperature of 310° C. produced quantum dots with a first absorption peak of 480 nm. An initial reaction temperature of 270° C. produced quantum dots with a first absorption peak of 454 nm.

Example II

Preparation of Semiconductor Nanocrystals Capable of Emitting Green Light with 3,5-di-tert-butyl-4-hydroxybenzylphosphonic acid Synthesis of CdSe Cores:

45.94 mmol of cadmium acetate was dissolved in 669.55 mmol of tri-n-octylphosphine at 100° C. in a 250 mL 3-neck round-bottom flask and then dried and degassed for one hour. 814.69 mmol of trioctylphosphine oxide and 104.85 mmol of octadecylphosphonic acid were added to a 0.5 L stainless steel reactor and dried and degassed at 140° C. for one hour. After degassing, the Cd solution was added to the reactor containing the oxide/acid and the mixture was heated to 240° C. under nitrogen. Once the temperature reached 240° C., the heating mantle is removed from the reactor and 105 mL of 1.5 M aerated TBP-Se (see preparation below) was then rapidly injected. The reactor is then immediately submerged in partially frozen (via liquid nitrogen) squalane bath rapidly reducing the temperature of the reaction to below 100° C. The first absorption peak of the nanocrystals was 442 nm. The CdSe cores were precipitated out of the growth solution inside a nitrogen atmosphere glovebox by adding a 3:1 mixture of methanol and isopropanol. The isolated cores were then dissolved in hexane and used to make core-shell materials.

Preparation of aerated TBP-Se:

9.5 mol of tri-butyl phosphine (TBP) (Strem Lot A4329040) was loaded into a 3 L 3-neck round-bottom flask. A tank of dry compressed air was used to bubble dry air into the TBP at a rate of 4 L per minute. The temperature of the TBP was monitored during the aeration process.

| Elapsed Time (min) | Temperature (° C.) |
|---|---|
| 0 | 22.8 |
| 14 | 30.7 |
| 58 | 43.1 |
| 80 | 47.1 |
| 108 | 54.9 |
| 188 | 79.5 |

This aerated TBP was then used to make the 1.5 M TBP-Se by adding Se shot with stirring in an inert atmosphere for use in the core preparation above. Aeration is discontinued prior to elimination of any secondary phosphine formed during the aeration step.

Synthesis of Green Emitting CdSe/CdZnS Core-Shell Nanocrystals:

517.3 mmol of trioctylphosphine oxide and 48.3 mmol of 3,5-di-tert-butyl-4-hydroxybenzylphosphonic acid were loaded into a 0.5 L glass reactor. The mixture was then dried and degassed in the reactor by heating to 120° C. for about an hour. The reactor was then cooled to 70° C. and the hexane solution containing isolated CdSe cores (1.55 mmol Cd content) was added to the reaction mixture. The hexane was removed under reduced pressure. Dimethyl cadmium, diethyl zinc, and hexamethyldisilathiane were used as the Cd, Zn, and S precursors, respectively. The Cd and Zn were mixed in equimolar ratios while the S was in two-fold excess relative to the Cd and Zn. The Cd/Zn (14.5 mmol and 33.8 mmol respectively) and S (48.3 mmol) samples were each dissolved in 40 mL of trioctylphosphine inside a nitrogen atmosphere glove box, Once the precursor solutions were prepared, the reaction flask was heated to 155° C. under nitrogen. The precursor solutions were added dropwise to the reactor at 155° C. at a rate of 20 mL per hour using a syringe pump. After the reaction proceeded for 1 hour, the precursor injection was stopped and the reaction temperature was allowed to return to room temperature. The nanocrystals were precipitated out of the growth solution by transferring to a 3:1 mixture of methanol and isopropanol and then isolating in a nitrogen atmosphere glovebox. The isolated core-shell nanocrystals were then dissolved in toluene. The material specifications were as follows: Emission=532 nm; FWHM=29 nm; QY=85% in toluene.

Example III

Preparation of Semiconductor Nanocrystals Capable of Emitting Red Light with a CdS Shell Synthesis of CdSe Cores:

26.23 mmol of cadmium acetate was dissolved in 235.4 mmol of tri-n-octylphosphine at 100° C. in a 250 mL 3-neck round-bottom flask and then dried and degassed for one hour. 465.5 mmol of trioctylphosphine oxide and 59.8 mmol of octadecylphosphonic acid were added to a 0.5 L stainless steel reactor and dried and degassed at 140° C. for one hour. After degassing, the Cd solution was added to the reactor containing the oxide/acid and the mixture was heated to 298° C. under nitrogen. Once the temperature reached 298° C., 425 mmol of aerated tri-n-butylphosphine (see preparation below) was injected into the flask. The temperature of the mixture was then raised to 305° C. where 105 mL of 1.5 M aerated TBP-Se (see preparation below) was then rapidly injected. The reaction was allowed to proceed for 13 minutes (aliquots taken at 1 minute intervals to observe the growth and corresponding absorption wavelength shift) at which point the reactor was then immediately submerged in partially frozen (via liquid nitrogen) squalane bath rapidly reducing the temperature of the reaction to below 100° C. The first absorption peak of the nanocrystals was 561 nm. The CdSe cores were precipitated out of the growth solution inside a nitrogen atmosphere glovebox by adding a 3:1 mixture of methanol and isopropanol. The isolated cores (abs=557 nm) were then dissolved in hexane and used to make core-shell materials.

Preparation of Aerated TBP-Se:

9.5 mol of TBP (Strem Lot A4329040) was loaded into a 3 L 3-neck round-bottom flask. A tank of dry compressed air was used to bubble dry air into the TBP at a rate of 4 L per minute. The temperature of the TBP was monitored during the aeration process.

| Elapsed Time (min) | Temperature (° C.) |
|---|---|
| 0 | 22.8 |
| 14 | 30.7 |
| 58 | 43.1 |
| 80 | 47.1 |
| 108 | 54.9 |
| 188 | 79.5 |

This aerated TBP was then combined with pure TBP (Strem 99%) in a ratio of 1:3 and then used as aerated TBP. The TBP-Se was made by mixing 105 mL of aerated TBP with 13.03 g of Se shot generating 1.5 M TBP-Se used in the core preparation above.

Synthesis of CdSe/CdS Core-Shell Nanocrystals:

517.3 mmol of trioctylphosphine oxide and 48.3 mmol of Octadecylphosphonic acid were loaded into a 0.5 L glass reactor. The mixture was then dried and degassed in the reactor by heating to 120° C. for about an hour. The reactor was then cooled to 70° C. and the hexane solution containing isolated CdSe cores (1.98 mmol Cd content) was added to the reaction mixture. The hexane was removed under reduced pressure followed by the addition of 85.33 mmol of decylamine. Dimethyl cadmium and hexamethyldisilathiane were used as the Cd and S precursors, respectively. The Cd and S were mixed in equimolar ratios. The Cd (10.37 mmol of dimethylcadmium) and S (10.37 mmol of hexamethyldisilathiane) samples were each dissolved in 40 mL of trioctylphosphine inside a nitrogen atmosphere glove box. Once the precursor solutions were prepared, the reaction flask was heated to 155° C. under nitrogen. The precursor solutions were added dropwise over the course of 2 hours at 155° C. using a syringe pump. After the shell growth, the nanocrystals were transferred to a nitrogen atmosphere glovebox and precipitated out of the growth solution by adding a 3:1 mixture of methanol and isopropanol. The isolated core-shell nanocrystals were then dissolved in hexane and precipitated a second time by adding a 3:1 mixture of methanol and isopropanol. The isolated core-shell nanocrystals were then dissolved in hexane and used to make QLEDs. The material specifications were as follows: Abs=605 nm; Emission=619 nm; FWHM=30 nm; QY=81% in Hexane.

Example IV

Preparation of Semiconductor Nanocrystals Capable of Emitting Green Light with a CdZnS Shell Synthesis of CdSe Cores:

45.94 mmol of cadmium acetate was dissolved in 669.55 mmol of tri-n-octylphosphine at 100° C. in a 250 mL 3-neck round-bottom flask and then dried and degassed for one hour. 814.69 mmol of trioctylphosphine oxide and 104.85 mmol of octadecylphosphonic acid were added to a 0.5 L stainless steel reactor and dried and degassed at 140° C. for one hour. After degassing, the Cd solution was added to the reactor containing the oxide/acid and the mixture was heated to 270° C. under nitrogen. Once the temperature reached 270° C., the heating mantle was removed from the reactor and 139.9 mmol of diisobutylphosphine selenide (DIBP-Se) dissolved in 105 mL of 1-Dodecyl-2-pyrrolidinone (NDP) (1.5 M DIBP-Se) was then rapidly injected. The reactor was then immediately submerged in partially frozen (via liquid nitrogen) squalane bath rapidly reducing the temperature of the reaction to below 100° C. The first absorption peak of the nanocrystals was 447 nm. The CdSe cores were precipitated out of the growth solution inside a nitrogen atmosphere glovebox by adding a 3:1 mixture of methanol and isopropanol. The isolated cores were then dissolved in hexane and used to make core-shell materials.

Synthesis of Green Emitting CdSe/CdZnS Core-Shell Nanocrystals:

517.3 mmol of trioctylphosphine oxide and 48.3 mmol of 3,5-di-tert-butyl-4-hydroxybenzylphosphonic acid were loaded into a 0.5 L glass reactor. The mixture was then dried and degassed in the reactor by heating to 120° C. for about an hour. The reactor was then cooled to 70° C. and the hexane solution containing isolated CdSe cores (3.96 mmol Cd content) was added to the reaction mixture. The hexane was removed under reduced pressure. Dimethyl cadmium, diethyl zinc, and hexamethyldisilathiane were used as the Cd, Zn, and S precursors, respectively. The Cd and Zn were mixed in equimolar ratios while the S was in two-fold excess relative to the Cd and Zn. The Cd/Zn (13.1 mmol and 30.4 mmol respectively) and S (43.5 mmol) samples were each dissolved in 20 mL of trioctylphosphine inside a nitrogen atmosphere glove box. Once the precursor solutions were prepared, the reaction flask was heated to 155° C. under nitrogen. The precursor solutions were added dropwise to the reactor at 155° C. at a rate of 20 mL per hour using a syringe pump. After the reaction proceeded for 1 hour, the precursor injection was stopped and the reaction temperature was allowed to return to room temperature. The nanocrystals were precipitated out of the growth solution by transferring to a 3:1 mixture of methanol and isopropanol and then isolating in a nitrogen atmosphere glovebox. The isolated core-shell nanocrystals were then dissolved in toluene and used to make quantum dot composite materials. The material specifications were as follows: Emission=520 nm; FWHM=35 nm; QY=75% in toluene.

As used herein, the singular forms "a", "an" and "the" include plural unless the context clearly dictates otherwise. Thus, for example, reference to an emissive material includes reference to one or more of such materials.

Applicants specifically incorporate the entire contents of all cited references in this disclosure. Further, when an amount, concentration, or other value or parameter is given as either a range, preferred range, or a list of upper preferable values and lower preferable values, this is to be understood as specifically disclosing all ranges formed from any pair of any upper range limit or preferred value and any lower range limit or preferred value, regardless of whether ranges are separately disclosed. Where a range of numerical values is recited herein, unless otherwise stated, the range is intended to include the endpoints thereof, and all integers and fractions within the range. It is not intended that the scope of the invention be limited to the specific values recited when defining a range.

Other embodiments of the present invention will be apparent to those skilled in the art from consideration of the present specification and practice of the present invention disclosed herein. It is intended that the present specification and examples be considered as exemplary only with a true scope and spirit of the invention being indicated by the following claims and equivalents thereof.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

The invention claimed is:

1. A method for making semiconductor nanocrystals, the method comprising:
   providing a solution including a metal source and a liquid medium at a reaction temperature greater than 200° C.,
   adding a secondary phosphine chalcogenide to the solution to form a reaction product comprising a semiconductor comprising a metal and a chalcogen, and
   quenching the reaction mixture immediately upon completion of addition of the secondary phosphine chalcogenide resulting in quantum dots comprising the semiconductor.

2. A method in accordance with claim 1 wherein the solution further includes a phosphonate species.

3. A method in accordance with claim 2 wherein the solution further includes phosphonite species.

4. A method in accordance with claim 1 wherein the solution further includes a phosphonite species.

5. A method in accordance with claim 1 wherein the solution further includes carboxylate species.

6. A method in accordance with claim 1 wherein the step of quenching includes rapidly cooling the reaction mixture immediately upon completion of addition of the secondary phosphine chalcogenide.

7. A method in accordance with claim 6 wherein the reaction mixture is cooled to a temperature that is about 200° C. or below.

8. A method in accordance with claim 6 wherein the reaction mixture is cooled to a temperature that is about 100° C. or below and further comprising isolating the semiconductor nanocrystals after cooling.

9. A method in accordance with claim 8 wherein the method further comprises overcoating at least a portion of the isolated semiconductor nanocrystals with a coating.

10. A method in accordance with claim 9 wherein the method further comprises overcoating at least a portion of the isolated semiconductor nanocrystals with a coating in the absence of an amine.

11. A method in accordance with claim 6 wherein the reaction mixture is cooled to a temperature at which the quantum dot growing process is terminated.

12. A method in accordance with claim 1 wherein the step of quenching includes rapidly cooling the reaction mixture immediately upon completion of addition of the secondary phosphine chalcogenide to stop growth of the semiconductor nanocrystals formed in reaction mixture.

13. A method in accordance with claim 1 wherein the ratio of moles of secondary phosphine chalcogenide to moles of metal included in the solution is greater than or equal to 1.

14. A method in accordance with claim 1 wherein the semiconductor nanocrystals are made in the absence of an amine.

15. A method in accordance with claim 1 wherein the semiconductor nanocrystals formed in the reaction mixture are overcoated without being isolated from the reaction mixture.

16. A method in accordance with claim 1 wherein the secondary phosphine chalcogenide is formed by adding a chalcogen to an oxygen-treated liquid tertiary phosphine.

17. A population of semiconductor nanocrystals prepared in accordance with claim 1.

18. A method for preparing semiconductor nanocrystals, the method comprising mixing one or more chalcogen sources with an oxygen-treated tertiary phosphine to form a chalcogen precursor, forming a reaction mixture including the chalcogen precursor and one or more metal precursors, and heating the reaction mixture to form semiconductor nanocrystals comprising one or more metals and one or more chalcogens.

19. A method in accordance with claim 18 wherein the reaction temperature is greater than 200° C.

20. A method in accordance with claim 18 wherein the reaction is quenched to control the particle size of the nanocrystals formed.

* * * * *